United States Patent [19]
Montegari

[11] Patent Number: 5,109,167
[45] Date of Patent: Apr. 28, 1992

[54] PNP WORD LINE DRIVER

[75] Inventor: Frank A. Montegari, Wappingers Falls, N.Y.

[73] Assignee: International Business Machines Corp., Armonk, N.Y.

[21] Appl. No.: 635,865

[22] Filed: Dec. 28, 1990

[51] Int. Cl.⁵ ............... H03K 19/094; H03K 19/082
[52] U.S. Cl. .................................. 307/463; 307/449; 307/475; 365/230.06
[58] Field of Search ............ 307/463, 449, 475; 365/230.06

[56] References Cited
U.S. PATENT DOCUMENTS 4,398,102  8/1983  Stewart ........................ 365/230.06
4,631,425  12/1986  Koshimaru ..................... 307/449
5,022,010  6/1991  Chan ............................ 307/449

Primary Examiner—David Hudspeth
Assistant Examiner—Andrew Sanders
Attorney, Agent, or Firm—Sterne, Kessler, Goldstein & Fox

[57] ABSTRACT

The present invention is directed to a decoder implemented with metal oxide semiconductor (MOS) field effect transistors (FETs) and a bipolar transistor in a collector-follower configuration. In one embodiment, NPN transistors perform decoding, FETs are used as pull-up devices and a PNP transistor in a collector-follower configuration is used to drive the output line. In a second embodiment, FETs perform decoding and are used as pull-up devices, and a PNP in a collector-follower configuration is used to drive the output line.

11 Claims, 11 Drawing Sheets

PNP WORD LINE DRIVER

CROSS-REFERENCE TO OTHER APPLICATIONS

The following application of common assignee contains some common disclosure, and is believed to have an effective filing date identical with that of the present application: Bipolar Element Bifet Array Decoder.

BACKGROUND OF THE INVENTION

1. Field of the Invention

The present invention relates generally to decoders, and more particularly to decoders which are achieved using bifet technology.

2. Related Art

A decoder is a device having input and output lines. The decoder selects one of its output lines according to the combination of values present on its input lines. When selecting an output line, the decoder sets the output line to either a low voltage value or a high voltage value, depending on whether the output lines are high or low, respectively, when not selected by the decoder. As used herein, the terms "select" and "enable" are used interchangeably.

Decoders are often used as access controllers for memory devices. This is shown in FIG. 1, where a decoder 104 controls access to a memory device 108.

The decoder 104 has N input lines 102 and $2^N$ output lines 106 (the output lines 106 are also called word/bit lines 106 when the decoder 104 is used as an access controller as shown in FIG. 1). The memory device 108 has $2^N$ rows and W memory cells per row. A one-to-one correspondence exists between the $2^N$ word/bit lines 106 and the $2^N$ rows of the memory device 108.

Ordinarily, the decoder 104 maintains the word/bit lines 106 in an unenabled state. When it is desired to read from or write to a row 114 of the memory device 108, an address of the row 114 is placed on the input lines 102. In response to the address, the decoder 104 enables a word/bit line 116 which corresponds to the row 114. The decoder 104 maintains the other word/bit lines in the unenabled state. Once the word/bit line 116 is enabled, it is possible to either read from or write to the memory cells associated with the row 114 by means of data lines 110. A selection line 112 may be provided to select specific memory cells in the row 114 for reading and writing.

A conventional decoder 104' is shown in FIG. 2. The conventional decoder 104' contains first decoders 212, 214 and second decoders 202.

The first decoders 212, 214 each contain four input lines 216, 218 (which correspond to the input lines 102 in FIG. 1) and sixteen output lines 226, 228.

While only one second decoder 202 is shown in FIG. 2, in practice the conventional decoder 104' contains 256 second decoders 202. The second decoders 202 contain word/bit lines 224, which correspond to the word/bit lines 106 in FIG. 1.

The second decoder 202 contains only metal oxide semiconductor field effect transistors (MOSFET), and specifically negative field effect transistors (NFET) 208, 210 and positive field effect transistors (PFET) 204, 206. Circuits using metal oxide semiconductor NFETs and PFETs are often called complementary metal oxide semiconductors (CMOS).

The second decoder 202 has two input nodes 230, 232. The output lines 226, 228 are connected to the input nodes 230, 232, which are in turn connected to the gates of the NFETs 208, 210 and the PFETs 204, 206. Each of the second decoders 202 is connected to and receives input from a different combination of the output lines 226, 228.

In operation, an 8 bit address is divided into two 4 bit addresses. The two 4 bit addresses are applied to the first decoders 212, 214 on the input lines 216, 218. Normally, the first decoders 212, 214 maintain the output lines 226, 228 at a high voltage state, such that the output lines 226, 228 are not enabled. In response to the 4 bit addresses, the first decoders 212, 214 each cause one of their respective output lines 226, 228 to go to a low voltage state, such that the output lines 226, 228 in the low voltage state are enabled.

For any particular second decoder 202, if either or both of its input nodes 230, 232 (which are connected to the output lines 226, 228) are in a high voltage state, then either or both NFETs 208, 210 are conductive, and at least one of the PFETs 204, 206 is nonconductive. As a result, the word/bit line 224 is pulled down to a low voltage state, such that the word/bit line 224 is not enabled.

If the input nodes 230, 232 are both at a low voltage state, then the NFETs 208, 210 are nonconductive and the PFETs 204, 206 are conductive. As a result, the word/bit line 224 is pulled up to a high voltage state, such that the word/bit line 224 is enabled.

While representing a functional decoder 104, the conventional decoder 104' is flawed with respect to performance and density. Specifically, the conventional decoder 104' is relatively slow in operation because it uses only field effect transistors (FET) 204, 206, 208, 210. In general, FETs are relatively slower than other transistor types (such as bipolar). Also, the density of the conventional decoder 104' is relatively low because for a given driving power, FETs are physically larger than other transistor types (such as bipolar).

Another conventional decoder 104" is shown in FIG. 3. The conventional decoder 104" contains the first decoders 212, 214. The structure and operation 15 of the first decoders 212, 214 are as described above with reference to FIG. 2.

The conventional decoder 104" also contains second decoders 322. While only one second decoder 322 is shown in FIG. 3, in practice the conventional decoder 104" contains 256 second decoders 322. The second decoders 322 contain word/bit lines 314, which correspond to the word/bit lines 106 in FIG. 1.

The second decoder 322 contains only bipolar transistors 304, 306, 308. The second decoder 322 has two input nodes 324, 326. The output lines 226, 228 are connected to the input nodes 324, 326, which are in turn connected to the bases of the bipolar transistors 306, 308. Each of the second decoders 322 is connected to and receives input from a different combination of the output lines 226, 228.

In operation, an 8 bit address is divided into two 4 bit addresses. The two 4 bit addresses are applied to the first decoders 212, 214 on the input lines 216, 218. Normally, the first decoders 212, 214 maintain the output lines 226, 228 at a high voltage state, such that the output lines 226, 228 are not enabled. In response to the 4 bit addresses, the first decoders 212, 214 each cause one of their respective output lines 226, 228 to go to a low voltage state, such that the output lines 226, 228 in the low voltage state are enabled.

The bipolar transistors 306, 308 represent a NOR gate. The bipolar transistor 304 represents an emitter follower.

For any particular second decoder 322, if either or both of its input nodes 324, 326 are at a high voltage state, then at least one of the bipolar transistors 306, 308 is conductive. Consequently, the base of the bipolar transistor 304 is held at a low voltage state. As a result, the word/bit line 314 is pulled down to a low voltage state, such that the word/bit line 314 is not enabled.

If the input nodes 306, 308 are both at a low voltage state, then the bipolar transistors 306, 308 are nonconductive. Consequently, the base of the bipolar transistor 304 is pulled up to a high voltage state. As a result, the word/bit line 314 is pulled up to a high voltage state, such that the word/bit line 314 is enabled.

The conventional decoder 104" represents a functional decoder 104. Also, because it uses only bipolar transistors 304, 306, 308, the conventional decoder 104" solves the performance and density problems of the conventional decoder 104' since bipolar transistors are generally faster and physically smaller than FETs.

However, the conventional decoder 104" is flawed with respect to power dissipation. As shown in FIG. 3, the second decoders 322 always draw a significant amount of current. For example, while in the unenable state, the second decoders 322 draw current (and dissipate power) through the bipolar transistors 306, 308. While in the enabled state, the second decoders 322 draw current (and dissipate power) through the bipolar transistor 304.

FIG. 10 shows a conventional driving circuit of a decoder. Input to a decoder driving circuit would be the output of a decoding circuit of a decoder. For example, input line 1002 could be connected to the collectors of bipolar transistors 306 and 308 of FIG. 3. The driving circuit uses NPN transistor 1004 in an emitter-follower configuration.

The circuit is connected as follows. The emitter-collector path of NPN transistor 1004 is connected between an output line 1006 and $V_{CC}$ 1008. The base 1009 of the NPN transistor 1004 is connected to input line 1002. A resistor 1010 is connected between the emitter 1011 and $V_{EE}$ 1012. Output line 1006 is also connected to emitter 1011.

The circuit operates as follows. A low voltage on input line 1002 renders NPN transistor 1004 nonconductive. The level of output line 1006 would then be the level of $V_{EE}$ 1012. A high voltage on input line 1002 renders the transistor conductive. The voltage at emitter 1011 would be 1 $V_{BE}$ below the base voltage. Thus, even with an uplevel input of $V_{CC}$, the uplevel output of the circuit could be no more than 1 $V_{BE}$ below $V_{CC}$.

The emitter-follower configuration could be used to construct a fast, low density decoder with the ability to drive a large load. However, when used to drive a word line in a memory array, the relatively low maximum uplevel output of such a circuit would limit both the speed at which cells could be read and the degree of reliability with which cells could be written.

FIG. 11 shows a second conventional driving circuit of a decoder. The circuit uses a PNP transistor 1102 in a collector-follower configuration and a Shotkey diode 1104 to allow for a high uplevel output without saturating the transistor.

The circuit is connected as follows. The emitter-collector path of PNP transistor 1102 is connected between high voltage supply $V_{CC}$ 1106 and output line 1108. The anode-cathode path of Shotkey diode 1104 is connected between the collector 1109 and base 1111 of PNP transistor 1102. A resistor 1110 is connected between collector 1109 and low voltage supply $V_{EE}$ 1112. Input line 1114 is connected to base 1111. Output line 1108 is connected to collector 1109.

The circuit operates as follows. A high voltage on input line 1114 renders PNP transistor 1102 nonconductive. Voltage level on output line 1108 would then equal $V_{EE}$ 1112.

A low voltage on input line 1114 renders PNP transistor 1102 conductive. This enables $V_{CC}$ 1106 to pull up the voltage levels at collector 1109 and Shotkey diode 1104. Shotkey diode 1104 then pulls up the voltage level of base 1111. As the voltage at base rises, PNP transistor 1102 becomes less conductive, thus lowering the collector 1109 and base 1111 voltages.

To obtain maximum uplevel output, the size of Shotkey diode 1104 is such that the base voltage stabilizes just less than 1 $V_{BE}$ below $V_{CC}$ 1106. This voltage is the highest level at which PNP transistor 1102 will be conductive. The size of Shotkey diode 1104 is also such that collector 1109 stabilizes at a higher level than that of base 1111. Shotkey diode 1104 enables this to be accomplished without saturating (and therefore increasing switching time of) PNP transistor 1102.

A PNP transistor in a collector-follower configuration with a Shotkey diode could be used to construct a high performance decoder which produces a high uplevel voltage and dissipates little power. However, because Shotkey diodes are surface-interface rather than diffuse, this circuit presents potential yield problems in chip fabrication. Also, this circuit would require using a stand-alone Shotkey diode and would thus substantially increase the size of the decoder.

Therefore, there is a need for a high performance, high density decoder which produces a high uplevel voltage and dissipates little power and which does not use a Shotkey diode.

SUMMARY OF THE INVENTION

The present invention is a decoder implemented with metal oxide semiconductor (MOS) field effect transistors (FETs) and bipolar transistors in a collector-follower configuration. The decoder is characterized by the low power dissipation of FETs. The invention is further characterized by the high density and high performance of bipolar transistors. Finally, the invention is characterized by the high uplevel voltage of a collector-follower configuration.

BRIEF DESCRIPTION OF THE DRAWINGS

The present invention will be described with reference to the accompanying drawings, wherein.

DETAILED DESCRIPTION OF THE PREFERRED EMBODIMENTS

The present invention is directed to decoders which are implemented using bifet technology.

Figure 1:
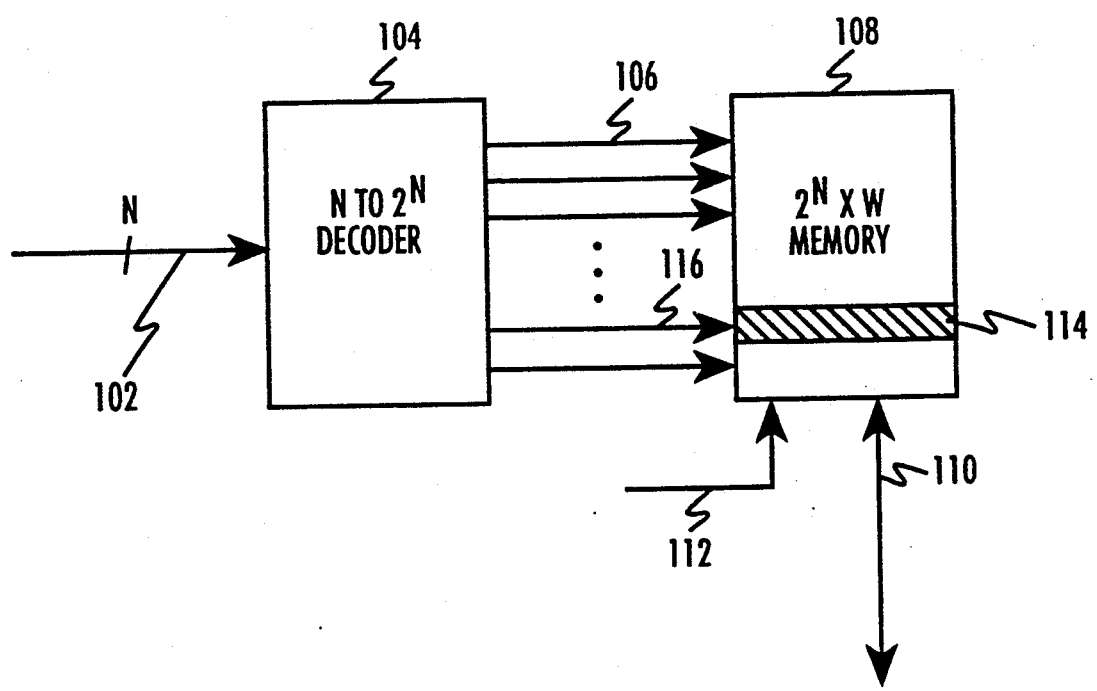
FIG. 1 illustrates a hardware environment in which the present invention may be utilized.
Figure 2:
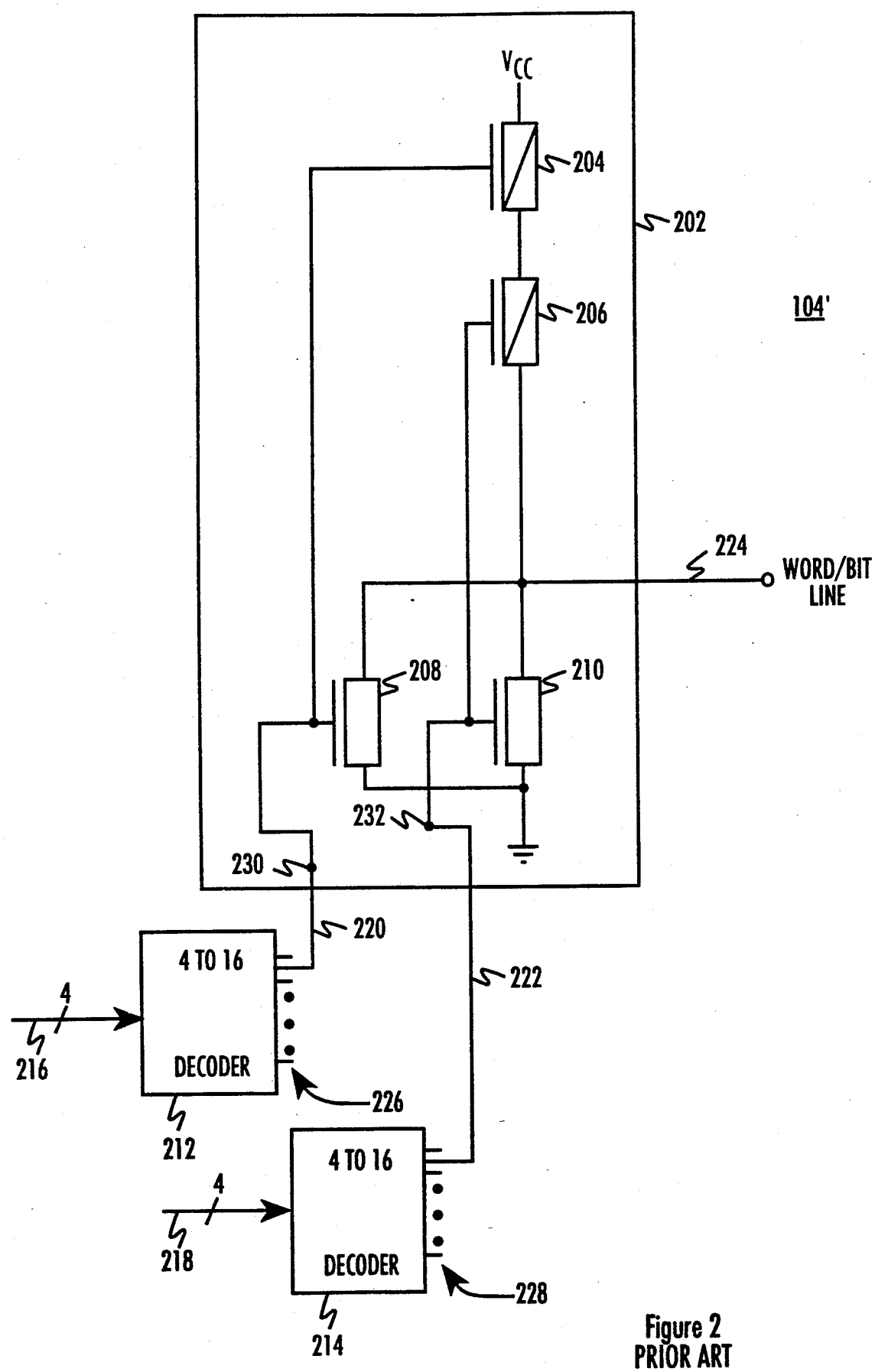
FIG. 2 illustrates a conventional FET decoder.
Figure 3:
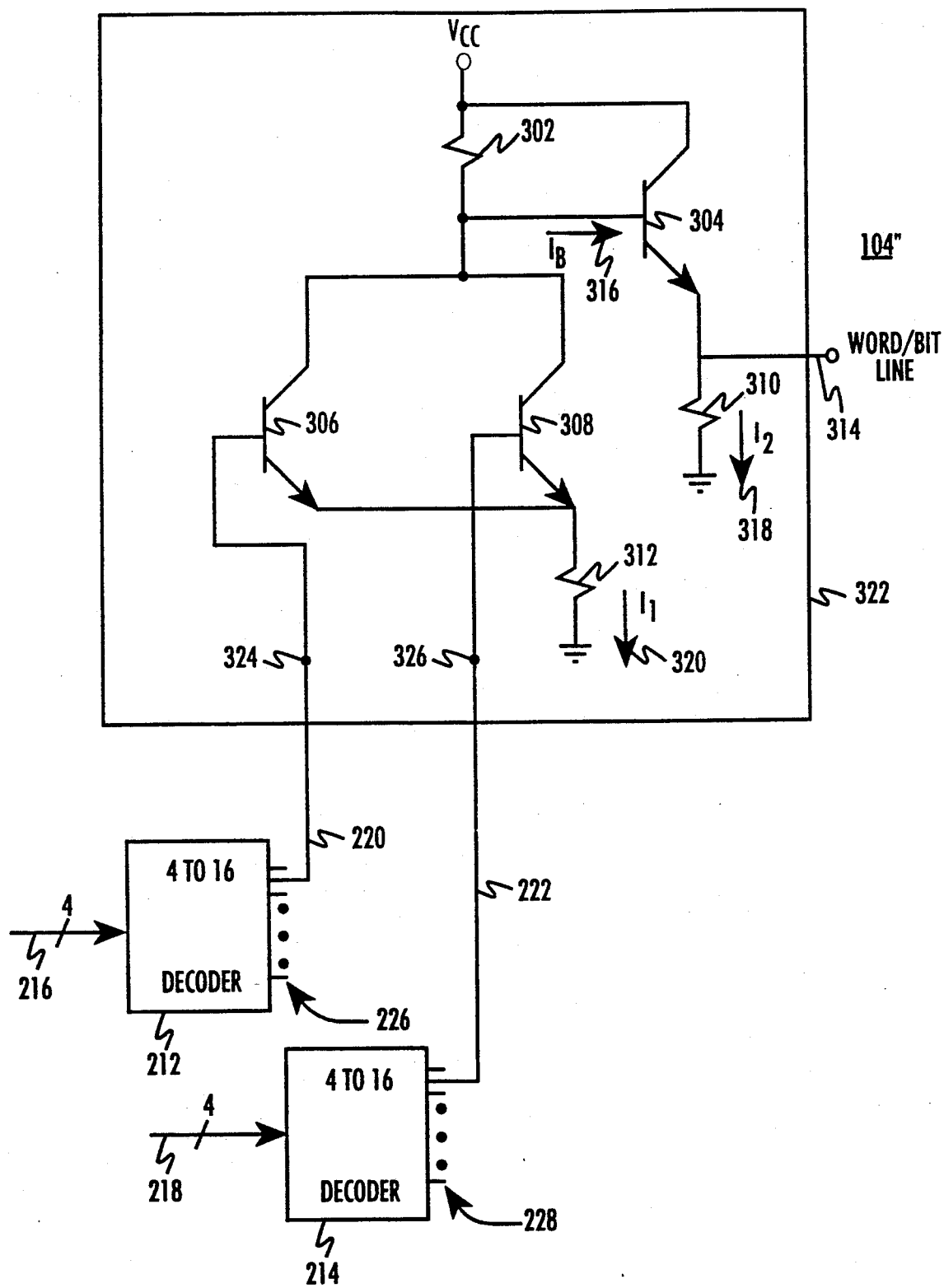
FIG. 3 illustrates a conventional bipolar decoder.

In the following description of the preferred embodiments of the present invention, reference is sometimes made to the use of the present invention as access controllers for memory devices as shown in FIG. 1. Such reference is made for the purpose of facilitating an understanding of the inventive concepts and their applications of the present invention. However, those with ordinary skill in the applicable art will appreciate that decoders are useful in other applications. Thus, the illustrative references to access controllers for memory devices are not intended in any way to be a limitation on the present invention or its applications.

Figure 4:
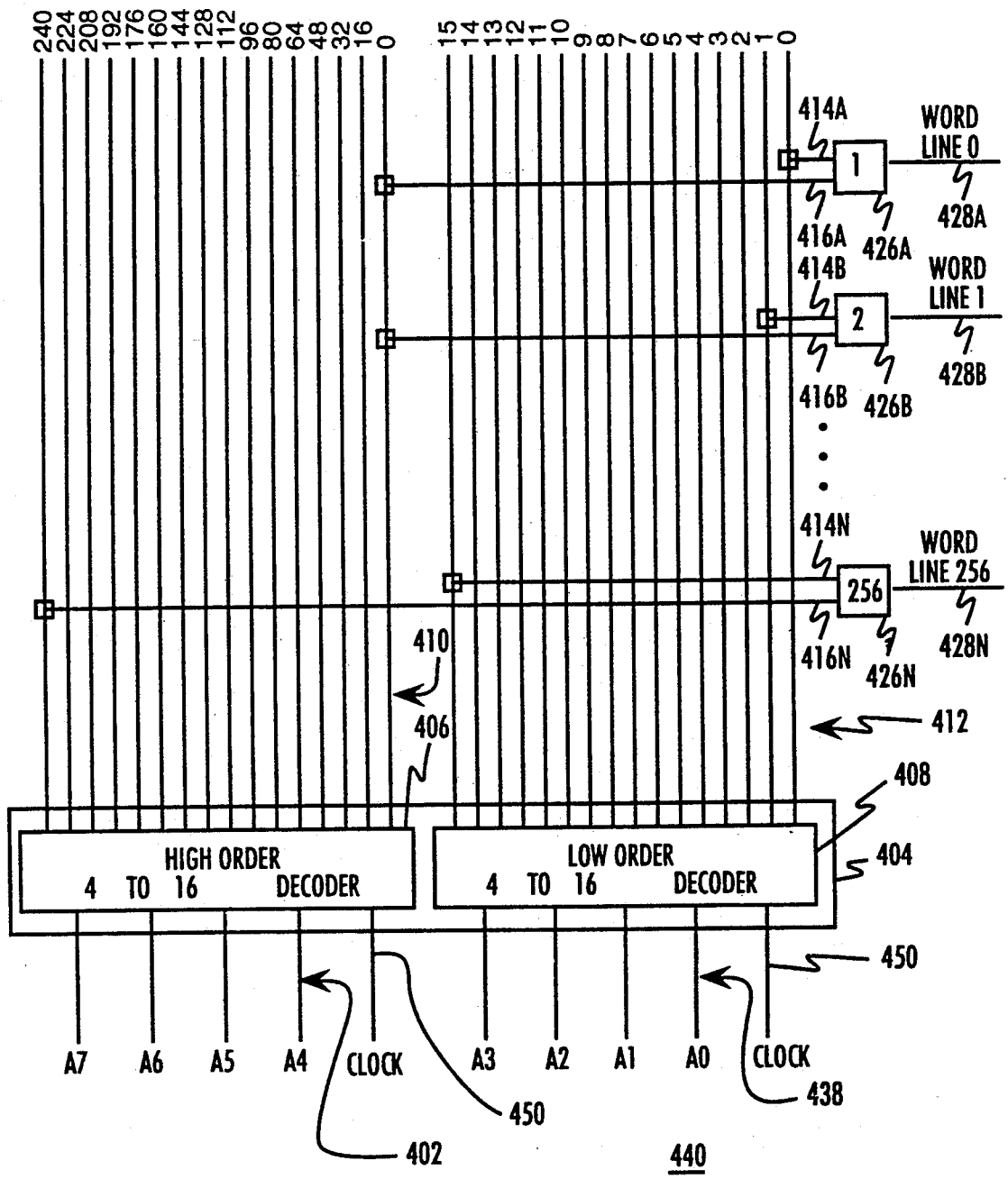
FIG. 4 illustrates a high-level structural diagram of a preferred embodiment of the present invention.

A high-level structural diagram of a preferred embodiment of the present invention is shown in FIG. 4. The preferred embodiment shown in FIG. 4 represents an 8-to-256 decoder 440. Those skilled in the applicable art will understand how to use the teachings of the present disclosure to make and use decoders of sizes other than 8-to-256.

The decoder 440 of the present invention contains a first decoder 404 and second decoders 426. The first decoder 404 contains a high-order 4-to-16 decoder 406 and a low-order 4-to-16 decoder 408. The high-order and low-order decoders 406, 408 each have 4 input or address lines 402, 438 and 16 output lines 410, 412.

While only three second decoders 426a, 426b, 426n are explicitly shown in FIG. 4., in practice the decoder 440 contains 256 second decoders 426, all having the same structure and operation. Each second decoder 426 has two input lines; see, for example, input lines 414a, 416a of the second decoder 426a. One input line 414a is connected to one of the output lines 412a of the low-order decoder 408. The other input line 416a is connected to one of the output lines 410 of the high-order decoder 406. In practice, each pair of input lines to a second decoder 426 is connected to a different combination of the output lines 410, 412 from the 4-to-16 decoders 406, 408. The second decoders 426 also have an output or word line; see for example output line 428a of decoder 426a.

In operation, an 8-bit binary address is placed on the input lines 402, 438 of the first decoder 404. The voltages at the input lines 402, 438 are at ECL levels (that is, approximately +0.5 to −0.5 volts). In response to the 8-bit binary address on the input lines 402, 438, the decoder 440 enables one of the output or word lines of the second decoders 426. The other 255 word lines are unenabled. Thus, the decoder 440 essentially translates from 8-bit binary values on the input lines 402, 438 to decimal values on the word lines 410, 412.

In the preferred embodiment of the present invention, the enabled word line is pulled up to a high voltage level. The unenabled word lines are pulled down to a low voltage level. The voltages at the word lines 428 are at CMOS-compatible levels.

The operation of the decoder 440 will now be described in greater detail. An 8-bit binary address is divided into a low-order 4-binary address and a high-order 4-bit binary address. The high-order 4-bit address is applied to the input 402 of the high-order decoder 406 and the low-order 4-bit address is applied to the input 402 of the low-order decoder 408.

In response to the high-order 4-bit address, the high-order decoder 406 enables one of its 16 output lines 410. The other 15 output lines 410 are unenabled.

Similarly, in response to the low-order 4-bit address, the low-order decoder 408 enables one of its 16 output lines 412. The other 15 output lines 412 are unenabled. Therefore, in response to the 8-bit address, the first decoder 404 enables two of its 16 output lines 410, 412.

Thus, the first decoder 404 essentially translates from 8-bit binary values on the input lines 402, 438 to hexadecimal values on the output lines 410, 412.

In the preferred embodiment of the present invention, while in the unenabled state, the output lines 410, 412 from the first decoder 404 are pulled up to a high voltage level. While in the enabled state, the output lines 410, 412 are pulled down to a low voltage level. The voltages at the output lines 410, 412 are at ECL-compatible levels (that is, approximately +0.5 to −1.3 volts). Note that the voltage levels corresponding to the enabled and unenabled states at the output lines 410, 412 connected to the first decoder 404 differ from those of the word lines 428 connected to the second decoders 426.

The high-level operation of the second decoders 426 will be described now with reference to the second decoder 426a.

As shown in FIG. 4., the input lines 414a, 416a of the second decoder 426a are connected to the output lines 410, 412 of the first decoder 404. If the voltage level on at least one of the input lines 414a, 416a is high (that is, at least one of the output lines 410, 412 connected to the input lines 414a, 416a is unenabled), then the second decoder 426a maintains its word lines 428 in an unenabled state. If the voltage level on both of the input lines 414a, 416a is low (that is, the output lines 410, 412 connected to the input lines 414a, 416a are enabled), then the second decoder 426 a enables its word line 428a.

Since only two of the output lines 410, 412 are enabled at any one time, and since the second decoders 426 are connected to different combinations of the output lines 410, 412, it is apparent that only one of the word lines 428, is enabled for any 8-bit binary address placed on the input lines 402, 438. Therefore, the preferred embodiment of the present invention shown in FIG. 4 realizes an 8-to-256 decoder.

The first decoder 404 will now be described in greater detail with reference to FIGS. 5, 6, and 7.

Figure 5:
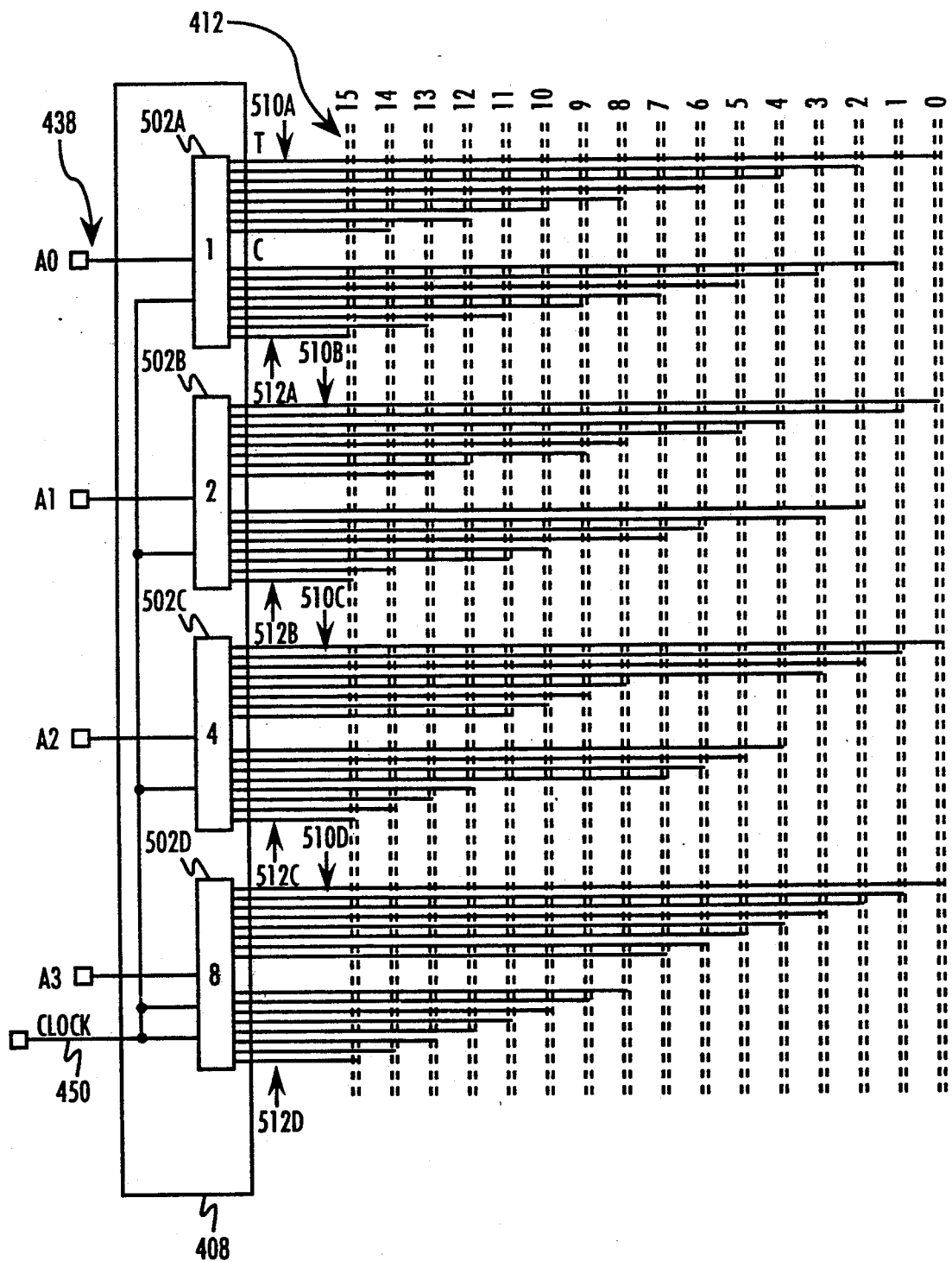
FIG. 5 illustrates a detailed structural diagram of a low-order decoder of the present invention.

FIG. 5 provides a detailed structural diagram of the low-order decoder 408 of the first decoder 404. FIG. 5 also illustrates the manner in which the low-order decoder 408 is connected to the output lines 412.

As shown in FIG. 5., the low-order decoder 408 contains four true/complement generators 502a, 502b, 502c, 502d. The true/complement generators 502, are each connected to a different input line 438. The true/complement generators 502 are also connected to a clock input 450. Each true/complement generator 502 has a number of true output lines 510a, 510b, 510c, 510d and complement output lines 512a, 512b, 512c, 512d.

In operation, the true/complement generators 502 generate true values of their respective inputs 438 on their respective true output lines 510. The true/complement generators 502 also generate complemented values of their respective inputs 438 on their respective complement output lines 512. For example, if the input A0 to the true/complement generator 502a is high, then the true output lines 510a would be high and the complement output lines 512a would be low.

The true output lines 510, and the complement output lines 512 are connected to the output lines 412 in a manner which ensures that a different output line 412 is enabled for each different combination of inputs present at the input lines 438. For example, if inputs A0=A1=A2=A3=low, then output line 0 is enabled. If inputs A0=high and A1=A2=A3=low, then output line 1 is enabled. Output lines 0 and 1 are unenabled for all other combinations of values on the input lines 438.

Figure 6:
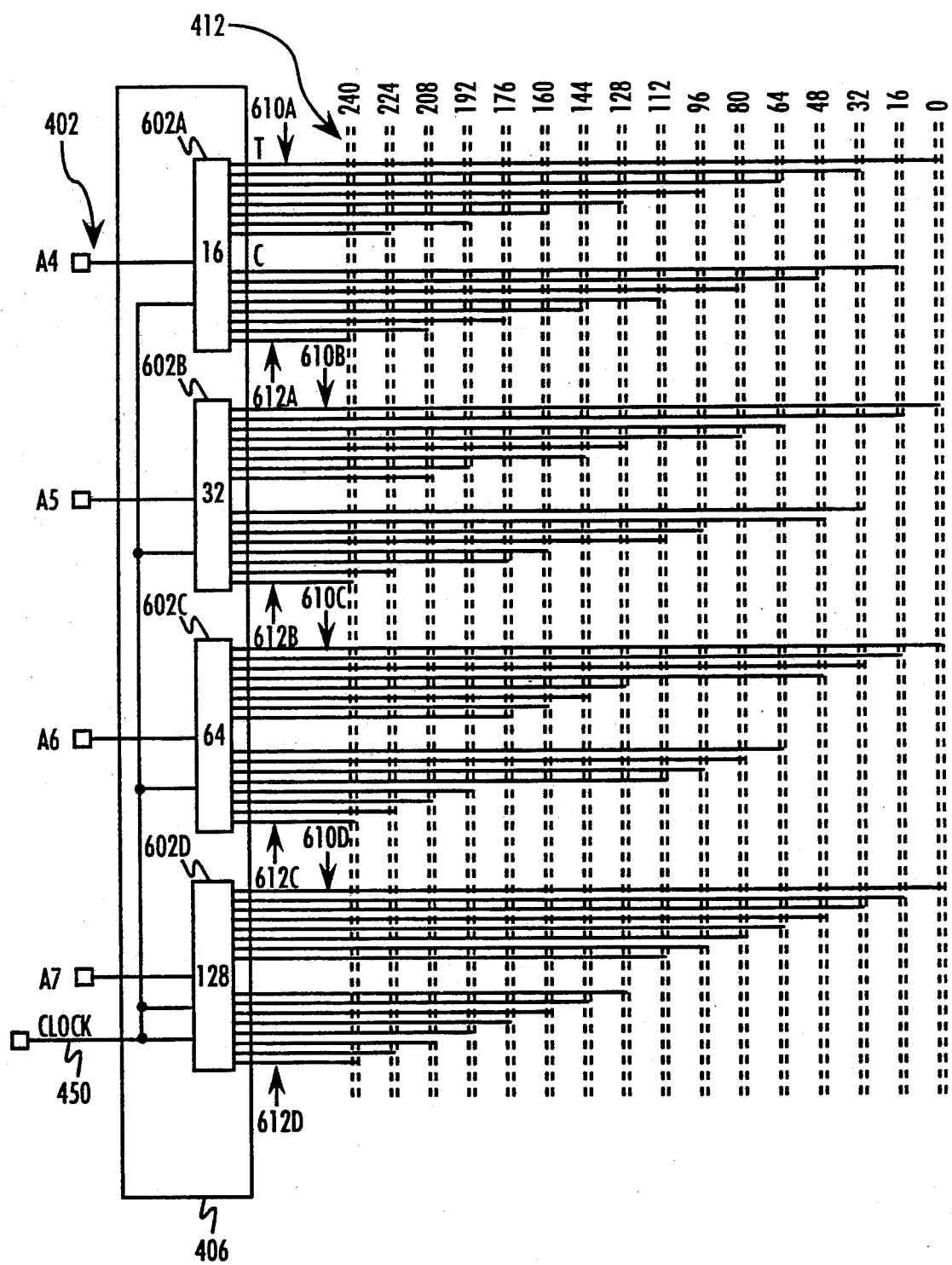
FIG. 6 illustrates a detailed structural diagram of a high-order decoder of the present invention.

FIG. 6 provides a detailed structural diagram of the high-order decoder 406 of the first decoder 404. FIG. 6 also illustrates the manner in which the high-order decoder 406 is connected to the output lines 410. The structure and operation of the high-order decoder 406 is similar to that of the low-order decoder 408. Therefore, for a discussion of the structure and operation of the high-order decoder 406, refer to the discussion above regarding the low-order decoder 408.

Figure 7:
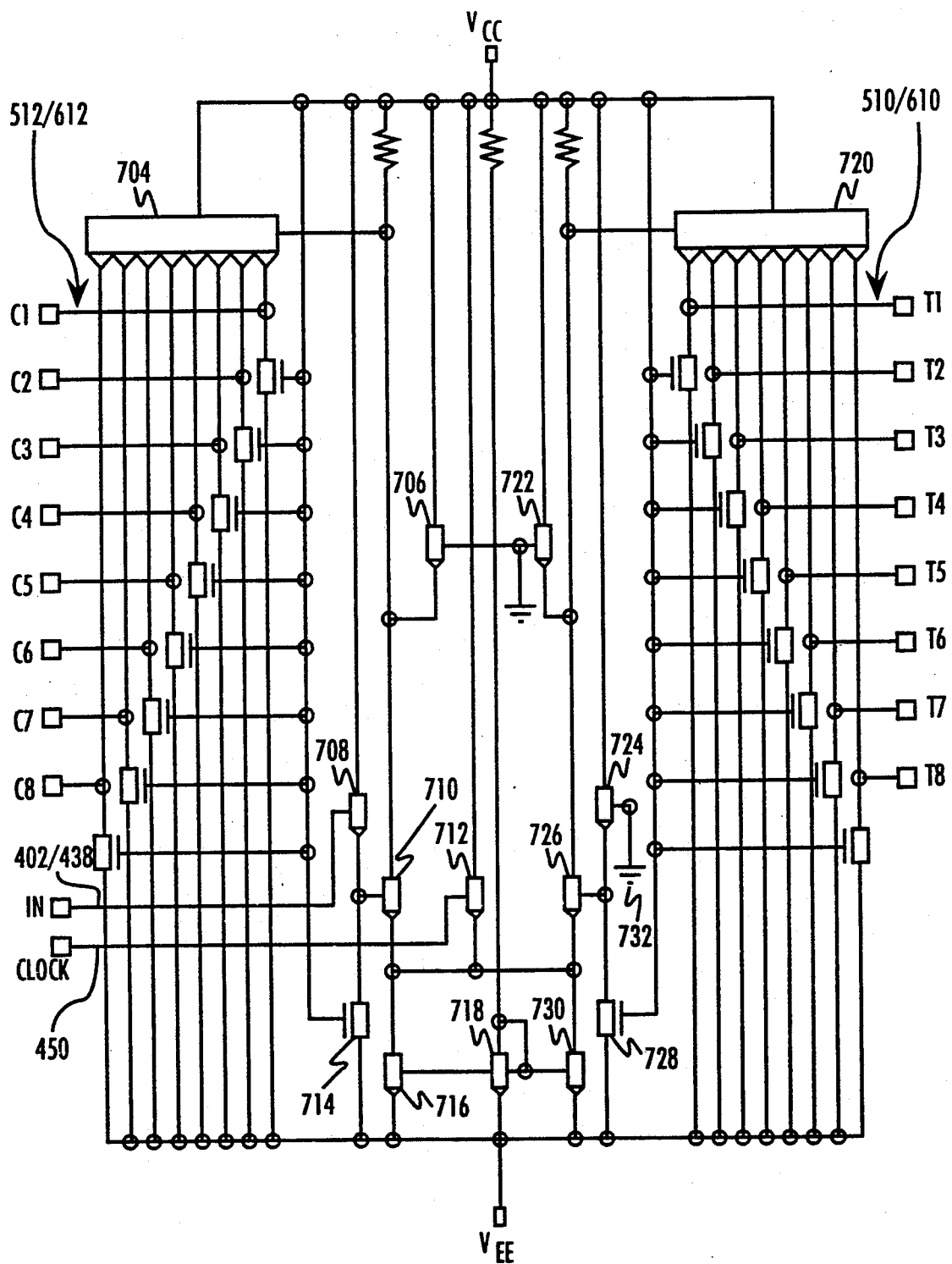
FIG. 7 illustrates a detailed structural diagram of a true/complement generator of the present invention.

FIG. 7 provides a detailed structural diagram of the true/complement generator 502/602.

The true/complement generator 502/602 contains bipolar NPN transistors 706, 708, 710, 712, 716, 718, 722, 724, 726, 730. The true/complement generator 502/602 further contains bipolar NPN emitter followers having multiple emitters 704, 720. The true/complement generator 502/602 still further contains multiple NFET transistors, including NFET transistors 714, 728.

The true/complement generator 502/602 has an input 402/438, which corresponds to one of the input lines 402, 438. The true/complement generator 502/602 also has a number of true output lines T1-T8, which correspond to one of the sets of true output lines 510/610, and a number of complement output lines C1-C8, which correspond to one of the sets of complement output lines 512/612. The true/complement generator 502/602 further has the clock input 450.

In operation, the true/complement generator 502/602 generates true values of the input 402/438 on the true output lines T1-T8, and generates complemented values of the input 402/438 on the complement output lines C1-C8.

The operation of the true/complement generator 502/602 will now be described in greater detail.

Transistors 716, 718, 730 essentially operate as a current source. Specifically, the collective operation of transistors 716, 718, 730 ensures that current is always flowing through at least one of the transistors 710, 712, 726 (that is, at least one of the transistors 710, 712, 726 is active at all times).

When transistors 724, 726 are active, their emitters are held at approximate voltages of −0.8 and −1.6, respectively. This is the case since (1) the base of transistor 724 is tied to ground; (2) the transistors 724, 726 are emitter followers; and (3) the base to emitter voltage drop ($V_{BE}$) of bipolar NPN transistors is approximately 0.8 volts.

Suppose the input 402/438 is high (that is, the input 402/438 is at a voltage of +0.5 volts). When the input 402/438 is high, the transistors 708, 710 are active. Their emitters are held at approximate voltages of −0.3 and −1.1, respectively.

The emitters of transistors 710, 726 are tied together at node 734. Since this node is at −1.1 volts when the input 402/438 is high, transistors 724, 726 are not fully active.

Since transistors 708, 710 are active and are pulling current from $V_{CC}$ to $V_{EE}$, the base of transistor 704 is pulled down. Since transistor 704 is an emitter follower with multiple emitters, the complement output lines C1-C8 are also pulled down. Thus, when the input 402/438 is high, the complement lines C1-C8 are low.

Since transistors 724, 726 are not fully active and are not pulling substantial amounts of current from $V_{CC}$ to $V_{EE}$, the base of transistor 720 is pulled up. Since transistor 720 is an emitter follower with multiple emitters, the true output lines T1-T8 are also pulled up. Thus, when the input 402/438 is high, the true output lines T1-T8 are high.

The operation of the true/complement generator 502/602 when the input 402/438 is low (that is, when the input 402/438 is at an approximate voltage of −0.5 volts) is analogous to that when the input 402/438 is high.

As noted above, the voltages at the output lines 410, 412 are at ECL-compatible levels. The voltages at the true output lines T1-T8 and the complement output lines C1-C8 are also at ECL-compatible levels.

In the preferred embodiment of the present invention, the first decoder 404 processes addresses on input lines 402, 438 only when the clock input 450 is low (that is, when the clock input 450 is at approximately −1.3 volts). Referring again to FIG. 7, the emitter of transistor 712 attempts to go down to −2.1 volts when the clock input 450 is low. Thus, transistor 712 does not affect the operation of transistors 710, 726 when the clock input 450 is low.

However, when the clock input 450 is high (that is, when the clock input 450 is at approximately +0.5 volts), transistor 712 is active. During this time, the emitter of transistor 712 is at approximately −0.3 volts. As a result, transistors 710, 726 are both substantially inactive. Therefore, the true/complement generator 502/602 is inactive while the clock input 450 is high. The true/complement generator 502/602 is active while the clock input 450 is low.

The structure and operation of the second decoders 426 will now be described in greater detail with reference to the second decoder 426.

Figure 8:
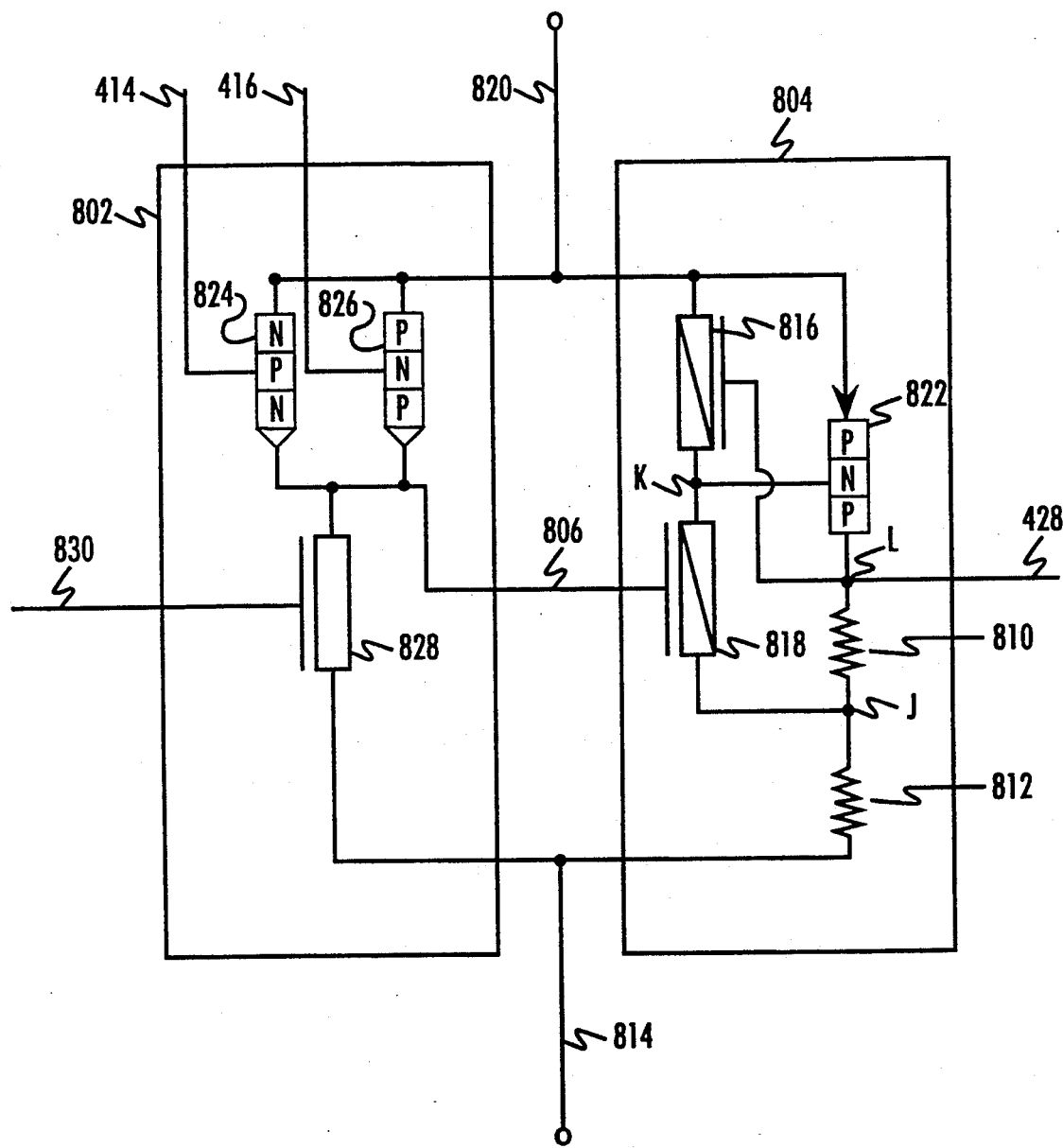
FIG. 8 illustrates a first embodiment of a second decoder of the present invention.

FIG. 8 illustrates a first embodiment of the second decoder 426 according to the present invention. The second decoder comprises a decoding circuit 802 which feeds into a driving circuit 804.

Decoding circuit 802 operates logically as an OR gate. When the voltage level on at least one of input lines 414 and 416 is high, decoding circuit 802 pulls the voltage level of decoding output line 806 high. Otherwide, decoding circuit 802 pulls line 806 low.

Driving circuit 804 operates logically as an inverter. Thus it enables word line 428 when the voltage level of line 806 is low and maintains word line 428 unenabled when the voltage level of line 806 is high.

Because line 806 is the output of decoding circuit 802, the decoding and driving circuits enable word line 428 only when input lines 414 and 416 are low.

Decoding circuit 802 is connected as follows. Two NPN transistors 824 and 826 have emitter-collector paths connected in parallel between line 806 and high voltage supply 820. The bases of NPN transistors 824 and 826 are connected to input lines 414 and 416, respectively. An NFET 828 could be connected between line 806 and low voltage supply 814, with its gate connected to a clock signal 830. Alternatively, a resistor could be connected between line 806 and low voltage supply 814.

Note that the use of NFET 828 reduces the power dissipation of the first embodiment of the invention. With a low clock signal, no current flows between decoding output and low voltage supply 814, and thus the circuit consumes negligible power.

On a digital level, decoding circuit 802 operates as follows. A high voltage on input line 414 or 416 render NPN transistor 824 or 826 conductive. High voltage supply 820 then pulls line 806 high. A low voltage on input line 414 and 416 renders NPN transistors 824 and 826 nonconductive. Low voltage supply 814 then pulls decoding output line 806 low.

Typical parameters for the circuit are a high voltage supply of +1.4 volts, low voltage supply of −2.2 volts, $V_{BE}$ of 0.8 volts, a high input of +0.5 volts and a low input of −1.3 volts.

Voltage level propagation through the decoding circuit 802 is as follows. As will be clarified below, line 806 (and therefore the emitters of NPN transistors 824 and 826) stabilizes at a high level of −0.3 volts and a low level of −2.0 volts. $V_{BE}$ for the transistors is +0.8 volts. Thus a level of +0.5 volts on either input line 414 or 416 (and thus the base of NPN transistor 824 or 826) is sufficiently high to render NPN transistor 824 or 826 conductive. When either transistor is conductive, the voltage of line 806 is pulled up until it stabilizes at −0.3 volts, i.e. +0.5 volts at the base minus +0.8 volts Vhd BE.

A level of −1.3 volts on both input lines 414 and 416 (and therefore the bases of NPN transistors 824 and 826) would be insufficiently low to render either NPN transistor 824 or 826 conductive. Thus, with a high clock signal and low voltage levels on both input lines 824 and 826, the low voltage supply 814 pulls line 806 down until it stabilizes at −2.0 volts (just above the level of low voltage supply 814).

Driving circuit 804 is connected as follows. Two resistors 810 and 812 are connected in series between low voltage supply 814 and word line 428. To facilitate explanation, the node between resistors 810 and 812 has been labeled node J. Two PFETs 816 and 818 are connected in series with source-drain path connected between node J and high voltage supply 820. The gate of PFET 816 is connected to word line 428 and the gate of PFET 818 is connected to decoder output line 806. A PNP transistor 822 has its emitter-collector path connected between high voltage supply 820 and word line 428. The base of PNP transistor 822 is connected to a node K between PFET 816 and PFET 818.

Digital level analysis of driving circuit 804 is as follows. A high signal at decoder output line 806 renders PFET 818 and PNP transistor 822 non-conductive. As a results, low voltage supply 814 pulls word line 428 low. This produces a low voltage at the gate of PFET 816, rendering PFET 816 conductive. High voltage supply 820 then pulls the base of PNP transistor 822 high, further rendering PNP transistor 822 nonconductive. Thus a high input to driving circuit 804 results in a low output on word line 428 at node L.

A low voltage on decoder output line 806 renders PFET 818 and PNP transistor 822 conductive. High voltage supply 820 then pulls up the voltage of word line 428 at node L and of the base of PNP transistor 822.

The values of resistors 810 and 812 are such that the voltage at the base of PNP transistor 822 stabilizes at a level low enough to keep PNP transistor 822 conductive, and the voltage at word line 428 at node L stabilizes at a level high enough to enable word line 428.

Voltage level propagation through the driving circuit is as follows. As explained above, the decoding circuit brings the voltage on decoder output line 806 to a high level of −0.3 volts high and to a low level of −2.0 volts.

A level of −0.3 volts on decoder output line 806 is insufficiently low to render PFET 818 and PNP 822 conductive. Rendering PNP 822 conductive would require a base voltage level of less than +0.6 volts, i.e., +1.4 volts at high voltage supply and emitter minus +0.8 volts $V_{BE}$. Rendering PFET 818 conductive would require a level at the gate of less than the level at the drain minus threshold voltage. PFET 818 has a threshold of 0.95 volts. With a drain level of +0.6 (the level at the base of PNP 822), PFET 818 would only be conductive with a gate level below −0.35 volts, i.e., +0.6 volts at drain minus 0.95 volt threshold.

Thus with decoder output line 806 high, PNP 822 is nonconductive. With PNP transistor 822 nonconductive, voltage on word line 428 equals that of low voltage supply 814, that is, −2.2 volts.

A level of −2.0 volts on word line 428 at node L, on the other hand, is less than −0.35 volts and thus renders both PFET 818 and PNP transistor 822 conductive. High voltage supply 820 then pulls up the voltage of word line 428 at node L and at the base of PNP transistor 822. As the voltage at the base of PNP transistor 822 rises, PNP transistor 822 becomes less conductive, lowering the voltage of word line 428 at node L and at the base of PNP transistor 822.

The values of resistors 810 and 812 are such that the voltage at the base of PNP transistor 822 stabilizes at the highest level at which PNP transistor 822 would be conductive. This level is +0.6 volts, i.e., voltage at the emitter less one $V_{BE}$: +1.4 volts at emitter minus +0.8 volts $V_{BE}$.

The values of resistor 810 and resistor 812 are also such that the level of word line 428 at node L stabilizes as high as possible without saturating PNP transistor 822. (Saturation is undesirable because it would increase the switching time of PNP transistor 822). This level is +1.2 volts, i.e., +0.6 volts at base plus +0.6 volts by which voltage at collector could exceed voltage at base without causing saturation.

Figure 9:
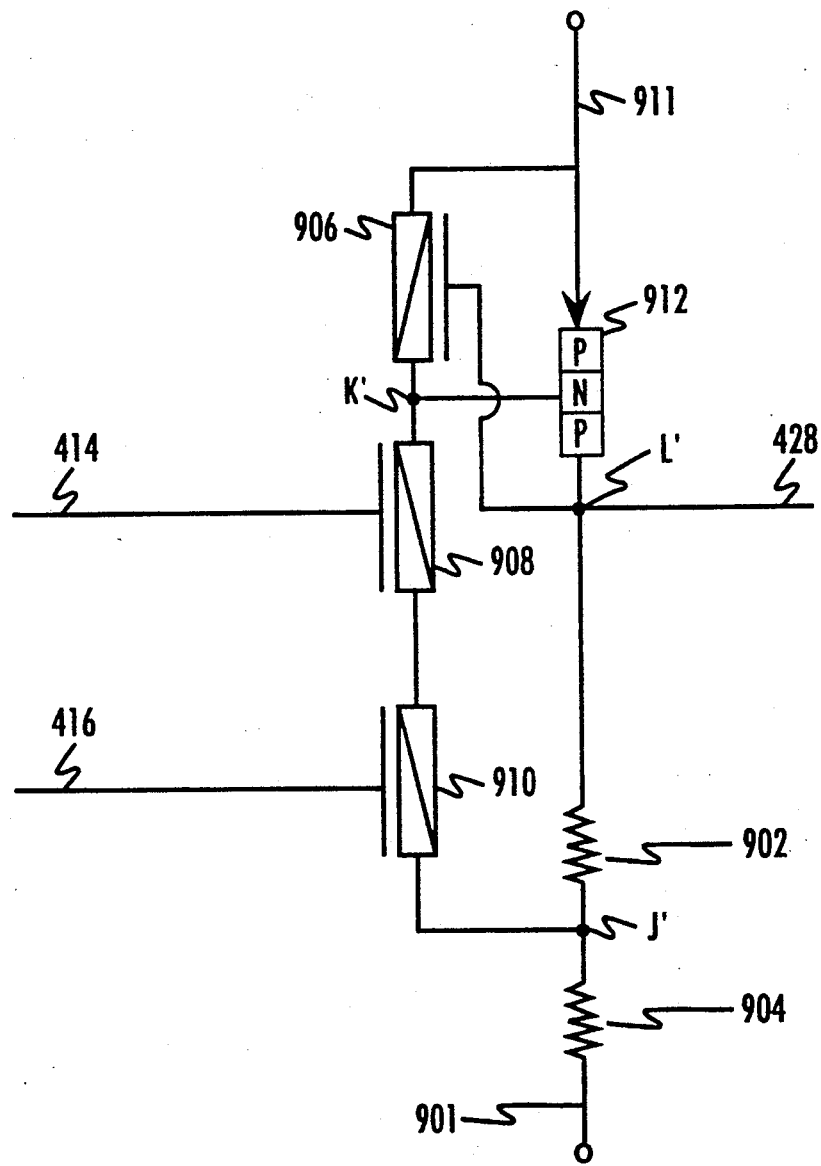
FIG. 9 illustrates a second embodiment of a second decoder of the present invention.
Figure 10:
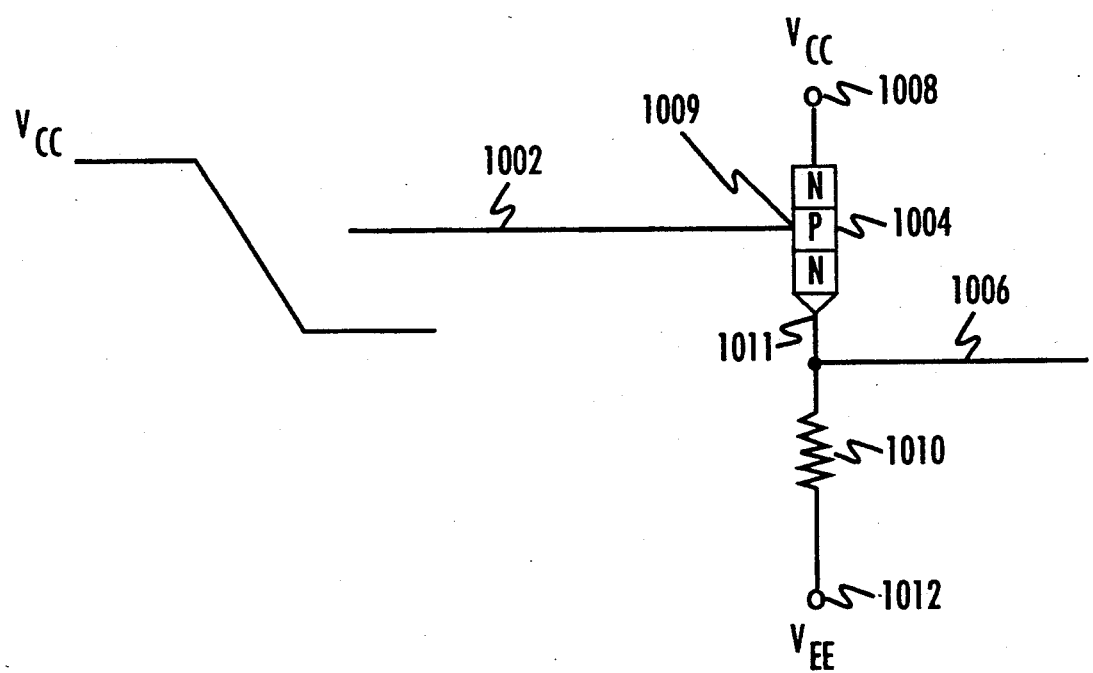
FIG. 10 illustrates a conventional decoder driving circuit which uses an NPN transistor in emitter-follower configuration.
Figure 11:
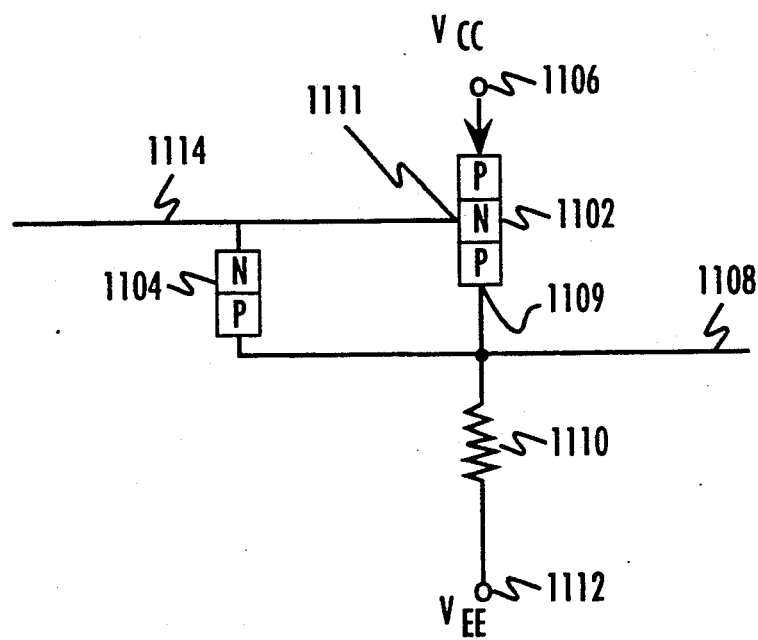
FIG. 11 illustrates a conventional decoder driving circuit which uses a Shotkey diode and a PNP transistor in collector-follower configuration.

FIG. 9 illustrates a second embodiment of the second decoder 426 according to the present invention. Although the second embodiment is lower density and dissipates less power than the first, the switching time of the second embodiment is slower than that of the first.

The second embodiment is connected as follows. Resistors 902 and 904 are connected in series between low voltage supply 901 and word line 428 at node L'. To facilitate explanation, the node between the two resistors has been labeled node J'. Three PFETs 906, 908 and 910 are connected in series with source-drain path connected between node J' and high voltage supply 911. The gate of PFET 906 is connected to word line 428 at node L'. The gates of PFETs 908 and 910 are connected to input lines 414 and 416 respectively. A PNP transistor 912 has its emitter-collector path connected between word line 428 at node L' and high voltage supply 911. The base of PNP transistor 912 is connected to a node K' between PFET 906 and PFET 908.

Digital level analysis of the second embodiment is as follows. A high voltage on input lines 414 and/or 416 renders PFETs 908 and/or 910 nonconductive. When either PFET 908 or 910 is nonconductive, no current flows out of the base of PNP transistor 912. PNP transistor 912 is thus nonconductive. As a result, low voltage supply 901 pulls word line 428 at node L' low. This produces a low voltage at the gate of PFET 906, rendering PFET 906 conductive. High voltage supply 911 then pulls the base of PNP transistor 912 high, further rendering PNP transistor 912 nonconductive. Thus if any of the input signals is high, output of the circuit will be low.

A low voltage on input lines 414 and 416 renders PFETs 908 and 910 and PNP transistor 912 conductive. High voltage supply 911 then pulls up the voltage on word line 428 at node L' and at the base of PNP transistor 912. The values of resistors 902 and 904 are such that the voltage at the base of PNP transistor 912 stabilizes at a level low enough to keep PNP transistor 912 conductive. The resistor values are also such that the voltage on word line 428 at node L' stabilizes at a level high enough to be interpreted as a high signal.

Voltage level propagation through the circuit is as follows. Typical parameters for the circuit are a high voltage supply of +1.4 volts, low voltage supply of −2.2 volts, a high input level of −0.2 volts and a low input level of −2.0.

A level of −0.2 volts on either input line 414 or 416 is insufficiently low to render PFETs 908 and 910 and PNP transistor 912 conductive. Rendering PNP transistor 912 conductive would require a base voltage level of less than +0.6 volts, i.e., +1.4 volts at high voltage supply and emitter minus 0.8 volts $V_{BE}$. Rendering PFETs 908 and 910 conductive would require a gate level less than the drain level minus the threshold. PFETs 908 and 910 each have thresholds of 0.95 volts. With a drain level of +0.6 volts (the level at the base of PNP 822), PFET 908 would only be conductive with a gate level below −0.35 volts, i.e., +0.6 volts at drain minus 0.95 volt treshold). If PFET 908 were conductive, the drain level of PFET 910 would be +0.6 volts. A gate level below −0.35 volts would therefore be required to render PFET 910 conductive as well.

Thus, with either input line 414 or 416 high, PNP transistor 912 would be nonconductive. With PNP transistor 912 nonconductive, voltage on word line 428 at node L' equals that of low voltage supply 901:−2.2 volts.

A level of −2.0 volts on both input line 414 and 416, on the other hand, is less than −0.35 volts and thus renders PFETs 908 and 910 and PNP transistor 912 conductive. High voltage supply 911 then pulls up the voltage on word line 428 at node L' and at the base of PNP transistor 822.

As the voltage at the base of PNP transistor 912 rises, PNP transistor 912 becomes less conductive, lowering the voltage at word line 428 at node L' and the base of PNP transistor 912. The values of resistor 902 and resistor 904 are such that the voltage at the base of PNP transistor 912 stabilizes at the highest level at which PNP transistor 912 would be conductive.

As with the first embodiment, the resistor values are such that the voltage at the base stabilizes at +0.6 volts and the voltage on word line 428 at node L' stabilizes at +1.2 volts.

While the preferred embodiments have been set forth, various modifications, alterations and changes may be made without departing from the spirit and scope of the present invention as defined in the appended claims.

What is claimed is:

1. A decoder-driver circuit implemented using bifet technology to exhibit high performance, high density, and low power dissipation, said decoder having multiple input lines for conducting signals at ECL-compatible voltage levels and an output line for conducting signals at CMOS-compatible voltage levels, for enabling said output line in response to a predetermined combination of ECL-compatible voltage level signals on said input lines, said decoder-driver circuit comprising:

voltage supply terminals;

a decoder circuit portion having gate means coupled to said voltage supply terminals for generating an OR output at said ECL-compatible voltage levels according to said input line signals; and a driver circuit portion, including
   an inverter comprising first and second field effect transistors having their source and drain electrodes coupled in series between said voltage supply terminals, said first field effect transistor having its gate electrode coupled to said OR gate means for inverting and amplifying said OR output to produce an inverted output at CMOS voltage levels, and
   a word line driver coupled to an output of said inverter for isolating and driving said output line according to said inverted output, said second field effect transistor having its gate electrode coupled to a node connecting said word line driver and said output line.

2. The decoder of claim 1, further comprising a clock signal for activating and deactivating said decoder.

3. The decoder of claim 1, wherein said gate means comprises a plurality of bipolar transistors coupled to said input lines and a gate output node to provide said OR output.

4. The decoder of claim 3, wherein said plurality of bipolar transistors are NPN transistors whose bases are connected to said input lines and whose emitters are connected together at said gate output node.

5. The decoder of claim 1, wherein said first and second field effect transistors comprise PFET transistors connected in source-to-drain configuration to form said inverter output.

6. The decoder of claim 1, wherein said word line driver comprises a bipolar PNP transistor whose base is connected to said inverter output and whose collector is connected to said output line.

7. The decoder of claim 1, further comprising power saving means coupled to said decoder circuit portion for minimizing power dissipation in said decoder.

8. The decoder of claim 7, wherein said power saving transistor comprises an NFET transistor whose gate is connected to a clock signal and whose drain is connected to said OR output, such that minimal current flows in said decoder when said clock signal is low.

9. The decoder of claim 1, further comprising a voltage divider coupled between said word line driver and one of said voltage supply terminals, said first field effect transistor having its drain electrode coupled to said voltage divider.

10. The decoder of claim 9, wherein said word line driver comprises a bipolar PNP transistor whose base is connected to said inverter output and whose collector is connected to said output line; and said voltage divider comprises first and second resistances connected in series with said PNP transistor between said voltage supply terminals, said first field effect transistor having its drain electrode coupled to the junction of said voltage divider resistances.

11. A decoder-driver circuit implemented using bifet technology to exhibit high performance, high density, and low power dissipation, said decoder having multiple input lines for conducting signals at ECL-compatible voltage levels and an output line for conducting signals at CMOS-compatible voltage levels, for enabling said output line in response to a predetermined combination of ECL-compatible voltage level signals on said input lines, said decoder-driver circuit comprising:

voltage supply terminals;

gate means comprising first and second field effect transistors having their source and drain electrodes coupled in series between said voltage supply terminals for generating an OR output at said ECL-compatible voltage levels according to said input line signals;

a word line driver coupled to said OR output for isolating and driving said output line according to said OR output to produce an output at CMOS voltage levels; and a third field effect transistor having its source and drain electrodes coupled in series with said first and second field effect transistors and its gate electrode coupled to a node connecting said word line driver and said output line.

* * * * *